(12) United States Patent
Sze (10) Patent No.: US 6,235,595 B1
(45) Date of Patent: May 22, 2001

(54) METHOD OF FABRICATING METAL OXIDE SEMICONDUCTOR

(75) Inventor: Jhy-Jyi Sze, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/213,599

(22) Filed: Dec. 17, 1998

(30) Foreign Application Priority Data

Oct. 19, 1998 (TW) ................................... 87117230

(51) Int. Cl.⁷ .................................................. H01L 21/336
(52) U.S. Cl. .............................................. 438/289; 438/291
(58) Field of Search ................................... 438/217, 289, 438/291, FOR 191

(56) References Cited

U.S. PATENT DOCUMENTS 5,688,704 * 11/1997 Liu .
5,696,021 * 12/1997 Chan et al. .
6,025,231 * 2/2000 Hutter et al. .

* cited by examiner

Primary Examiner—George Fourson
Assistant Examiner—Joanne A. Garcia
(74) Attorney, Agent, or Firm—Jiawei Huang; J.C. Patents (57) ABSTRACT

This invention provides a method for fabricating a metal oxide semiconductor. A pad oxide layer, a mask layer and an insulator layer are formed in sequence on a substrate. The insulator layer and the mask layer are patterned to form an opening that exposes the pad oxide layer. A self-aligned ion implantation process is performed by using the insulator layer and the mask layer as a mask. The pad oxide layer exposed by the opening is removed. A gate is formed on the substrate exposed by the opening.

8 Claims, 7 Drawing Sheets

METHOD OF FABRICATING METAL OXIDE SEMICONDUCTOR

CROSS-REFERENCE TO RELATED APPLICATION

This application claims the priority benefit of Taiwan application serial no. 87117230, filed Oct. 19, 1998.

BACKGROUND OF THE INVENTION

1. Field of the Invention

The present invention relates to a method of fabricating a metal oxide semiconductor. More particularly, the present invention relates to a method for fabricating a metal oxide semiconductor by performing a selective ion implantation process.

2. Description of the Related Art

In the conventional metal oxide semiconductor process, ion implantation processes are performed to adjust threshold voltage and the anti-punch-through effect. However, the dopant is implanted globally into the entire active region, including the area where the source/drain region is subsequently formed. Due to the global ion implantation process, the series resistance and the junction capacitance of the source/drain region are increased. Furthermore, the sidewall of the gate conductive layer is damaged by the reactive ion etching process performed for forming a gate, so that the reliability and the yield of the gate conductive layer are decreased.

FIGS. 1A through 1I are schematic, cross-sectional diagrams used to depict steps in a conventional method for fabricating a metal oxide semiconductor.

Figure 1A:
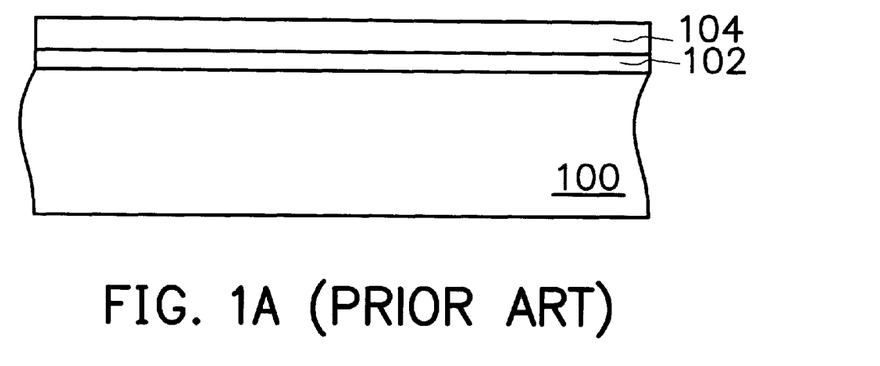
FIGS. 1A through 1I are schematic, cross-sectional diagrams used to depict steps in the conventional method for fabricating a metal oxide semiconductor.

Referring to FIG. 1A, a substrate 100 is provided. A pad oxide layer 102 and a mask layer 104 are formed in sequence on the substrate 100.

Figure 1B:
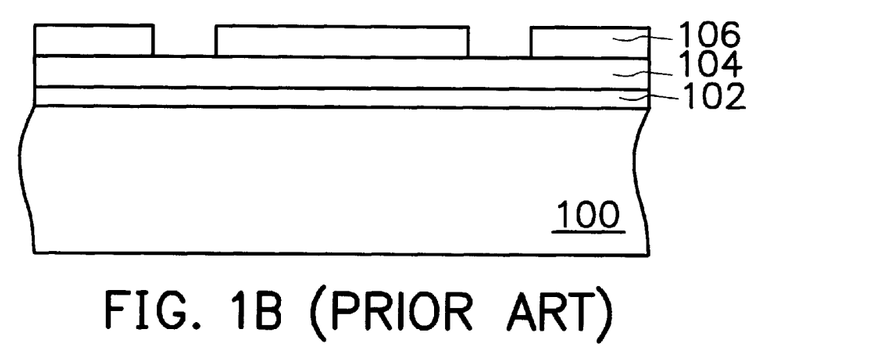

Referring to FIG. 1B, a patterned photoresist layer 106 is formed on the mask layer 104.

Figure 1C:
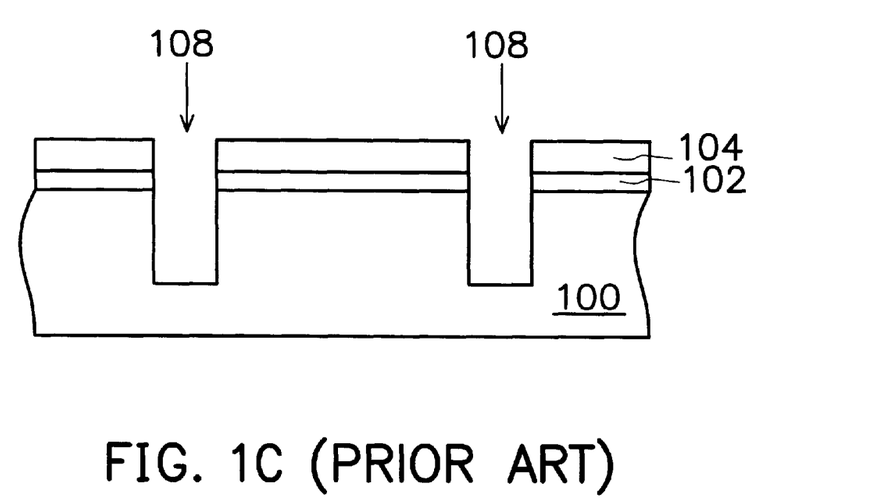

Referring to FIG. 1C, the mask layer 104, the pad oxide layer 102 and the substrate 100 are etched by dry etching; thus, a trench 108 is formed. Then, the photoresist layer 106 is removed.

Figure 1D:
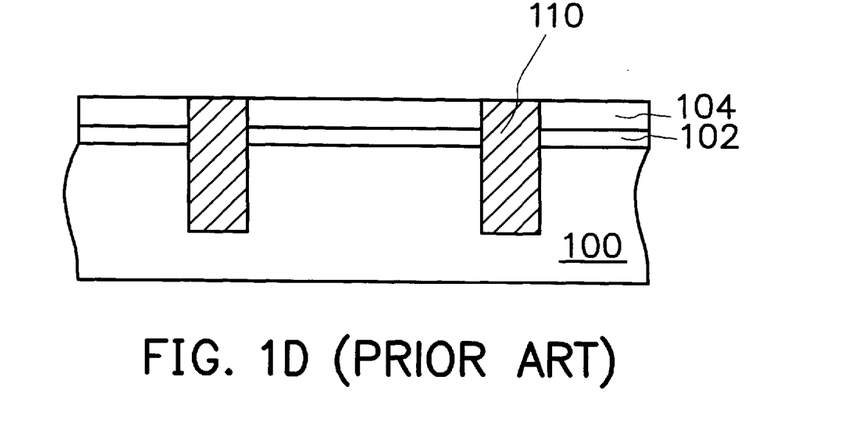

Referring to FIG. 1D, an insulator layer 110 is formed over the substrate 100 and fills the trench 108. A portion of the insulator layer 110 is removed to expose the mask layer 104 by chemical-mechanical polishing.

Figure 1E:
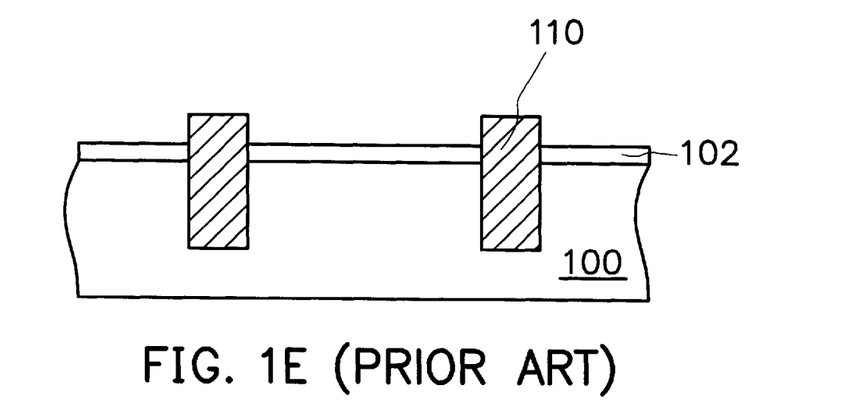

Referring to FIG. 1E, the mask layer 104 is removed by wet etching to expose the pad oxide layer 102.

Figure 1F:
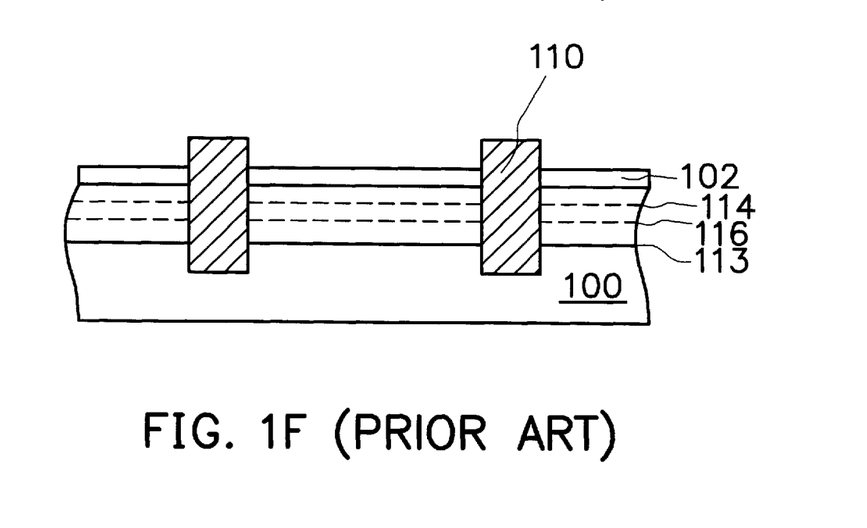

Referring to FIG. 1F, a global ion implantation process is performed by using the insulator layer 110 as a mask. The ion implantation process is performed three times in sequence to form three doped layers 113, 114 and 116, wherein the depths of the three doped layers 113, 114 and 116 are different. The doped layer 113 is used for forming a p-well or an n-well, the doped layer 114 is used for adjusting threshold voltage and the doped layer 116 is used for the anti-punch-through effect. During the second and the third ion implantation processes, the dopant is implanted globally into the entire active region, including the subsequently formed source/drain region, because only the insulator layer 110 is used as a mask. Due to the global ion implantation process, the series resistance and the junction capacitance of the source/drain region are increased.

Figure 1G:
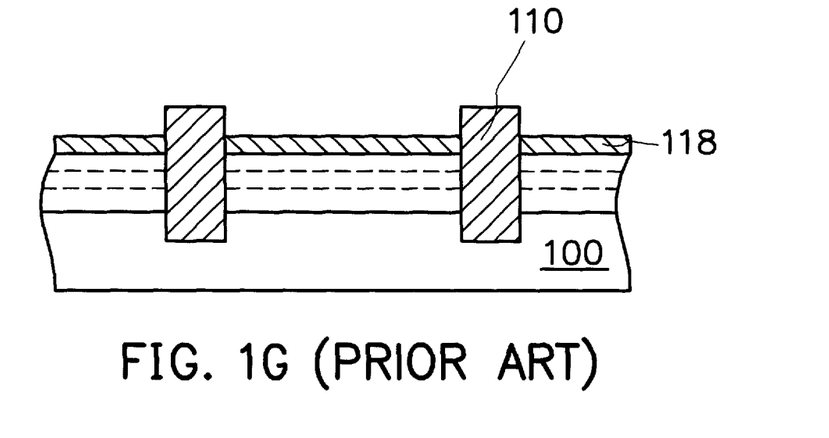

Referring to FIG. 1G, the pad oxide layer 102 is removed to expose the substrate 100 by anisotropic etching. A gate oxide layer 118 is formed on the substrate 100 by thermal oxidation.

Figure 1H:
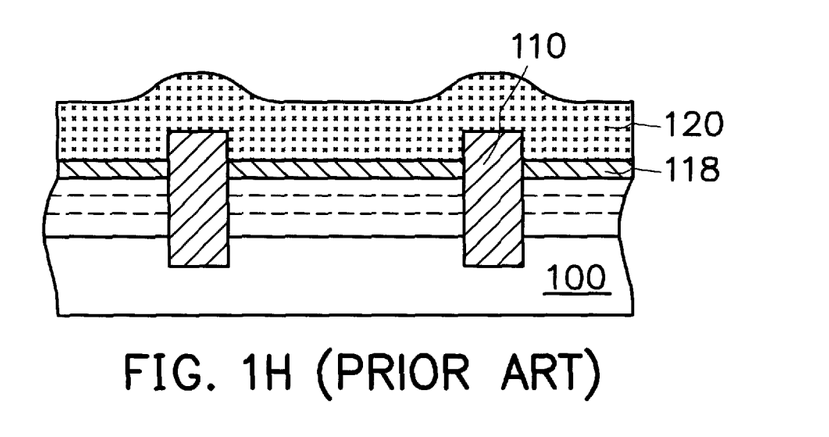

Referring to FIG. 1H, a conductive layer 120 is formed over the substrate 100 by chemical vapor deposition.

Figure 1I:
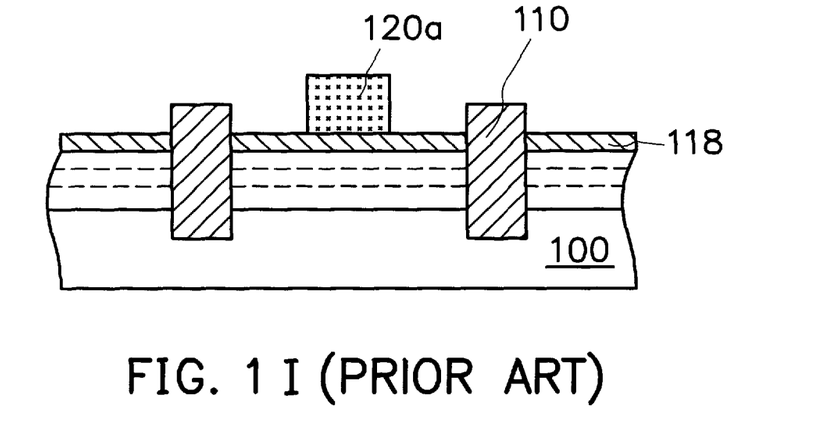

Referring to FIG. 1I, a reactive ion etching process is performed to remove a portion of the conductive layer 120, so that a gate conductive layer 120a is formed. However, the sidewall of the gate conductive layer 120a is also damaged during the reactive ion etching process. Thus, the reliability of the gate conductive layer 120a is decreased.

SUMMARY OF THE INVENTION

It is therefore an objective of the present invention to provide a method for fabricating a metal oxide semiconductor by using a self-aligned ion implantation process to avoid increases in the series resistance and the junction capacitance of the source/drain region.

It is another an objective of the present invention to provide a method for fabricating a metal oxide semiconductor to reduce the damage to the sidewall of the gate conductive layer.

To achieve these and other advantages and in accordance with the purpose of the invention, as embodied and broadly described herein, the invention provides a method for fabricating a metal oxide semiconductor. The method for fabricating this metal oxide semiconductor includes the following steps. A pad oxide layer, a mask layer and an insulator layer are formed in sequence on a substrate. An opening is formed in the insulator layer and the mask layer to expose the pad oxide layer. A self-aligned ion implantation process is performed by using the insulator layer and the mask layer as a mask. The pad oxide layer exposed by the opening is removed. A gate is formed on the substrate region that is exposed by the opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2J are schematic, cross-sectional diagrams used to depict steps in a method according to the invention for fabricating a metal oxide semiconductor.

Figure 2A:
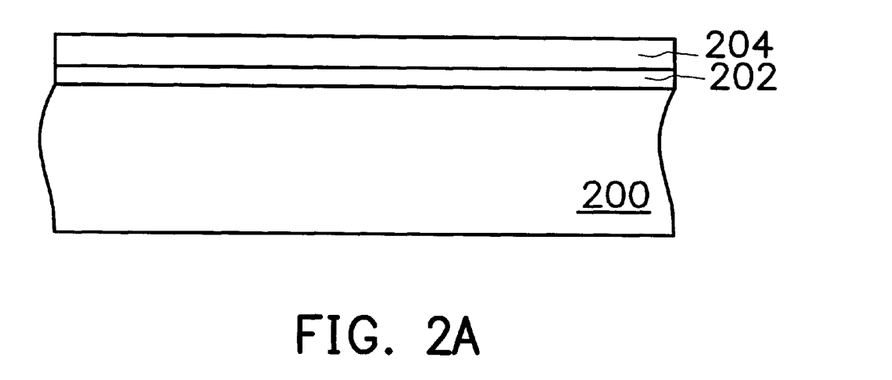
FIGS. 2A through 2J are schematic, cross-sectional diagrams used to depict steps in a method according to the invention for fabricating a metal oxide semiconductor.

Referring to FIG. 2A, a substrate 200 is provided. A pad oxide layer 202 is formed on the substrate 200 by, for example, thermal oxidation, wherein the thickness of the pad oxide layer is hundreds Å. A mask layer 204 is formed on the pad oxide layer 202 by, for example, low pressure chemical vapor deposition. The mask layer 204 includes silicon nitride. The thickness of the mask layer 204 is about 1000 to 2000 Å.

Figure 2B:
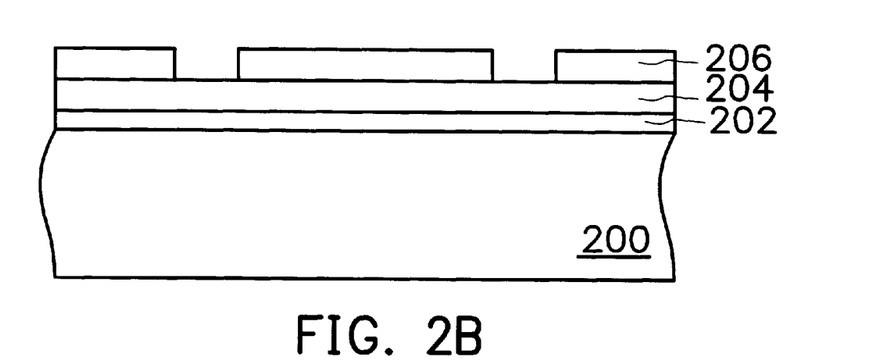

Referring to FIG. 2B, a patterned photoresist layer 206 is formed on the mask layer 204.

Figure 2C:
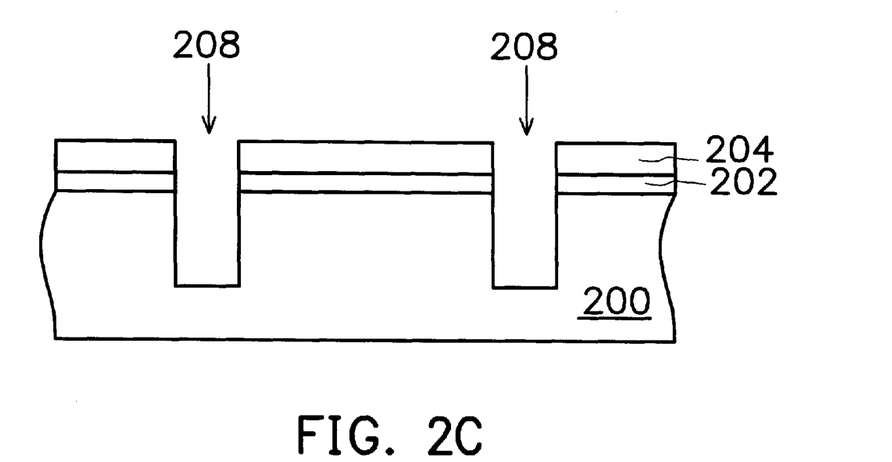

Referring to FIG. 2C, the mask layer 204, the pad oxide layer and the substrate 200 are etched to form a trench 208 by using the photoresist layer 206 as a mask. The etching process includes dry etching. Then, the photoresist layer 206 is removed.

Figure 2D:
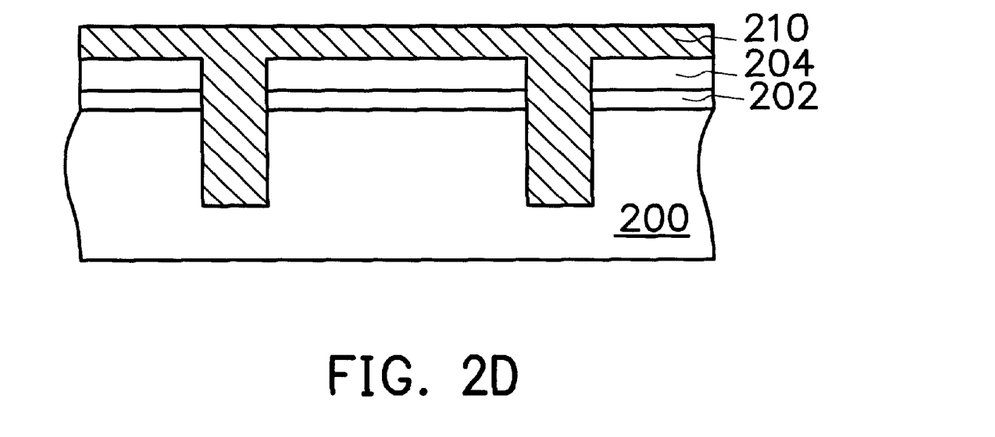

Referring to FIG. 2D, an insulator layer 210 is formed over the substrate 200 and fills the trench 208. The method of forming the insulator layer 210 includes chemical vapor deposition. The insulator layer 210 includes silicon dioxide. The insulator layer 210 is planarized by, for example, chemical-mechanical polishing.

Figure 2E:
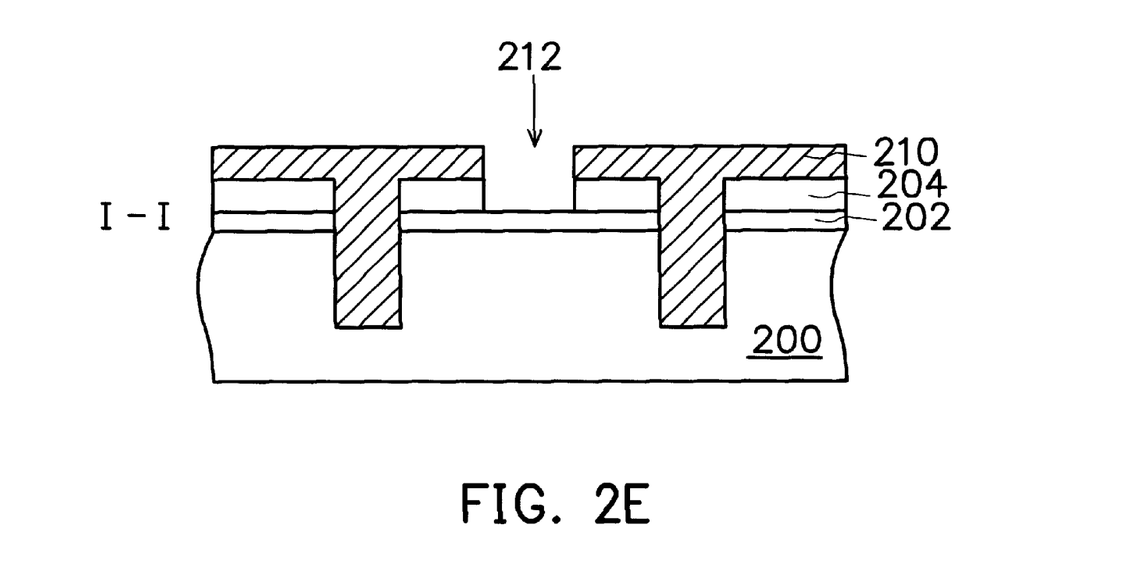

Referring to FIG. 2E, an opening 212 is formed in the insulator layer 210 and the mask layer 204 to expose the pad oxide layer 202 by etching.

Figure 2F:
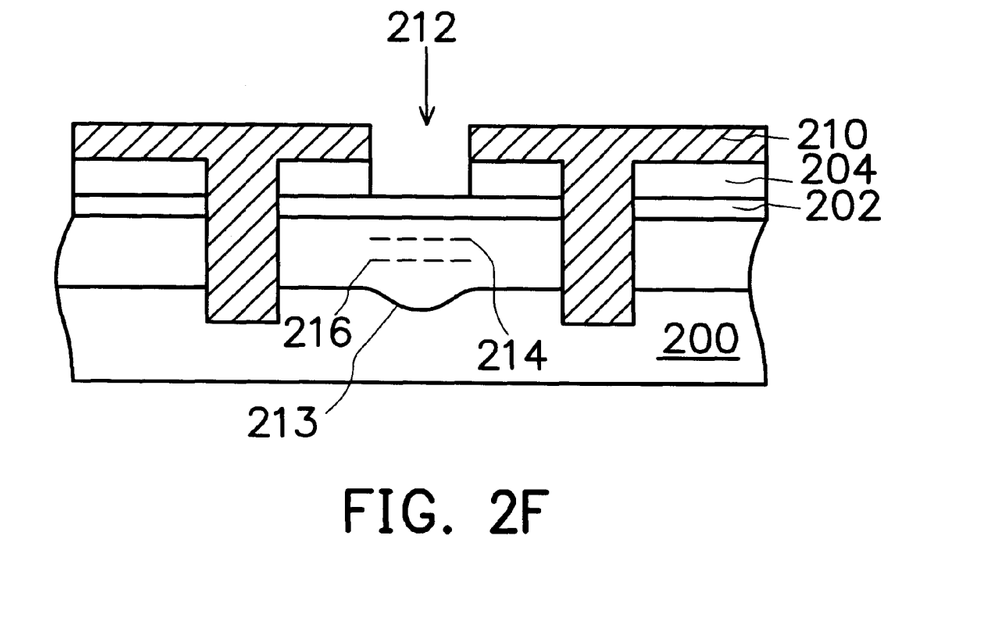

Referring to FIG. 2F, a self-aligned ion implantation process is performed by using the mask layer 204 and the insulator layer 210 as a mask. The ion implantation process is performed three times in sequence to form three doped layers 213, 214 and 216, wherein the depths of the three doped layers 213, 214 and 216 are different. The doped layer 213 is used for forming a p-well or an n-well, the doped layer 214 is used for adjusting threshold voltage and the doped layer 216 is used for the anti-punchthrough effect. During the second and the third ion implantation process, the dopant is implanted selectively into the portion of substrate 200 exposed by the opening 212 because the insulator layer 210 and the mask layer 204 are used as a mask. Thus, the dopant is not implanted into the area where the source/drain region is subsequently formed. The increase of the series resistance and the junction capacitance of the source/drain region are avoided.

Figure 2G:
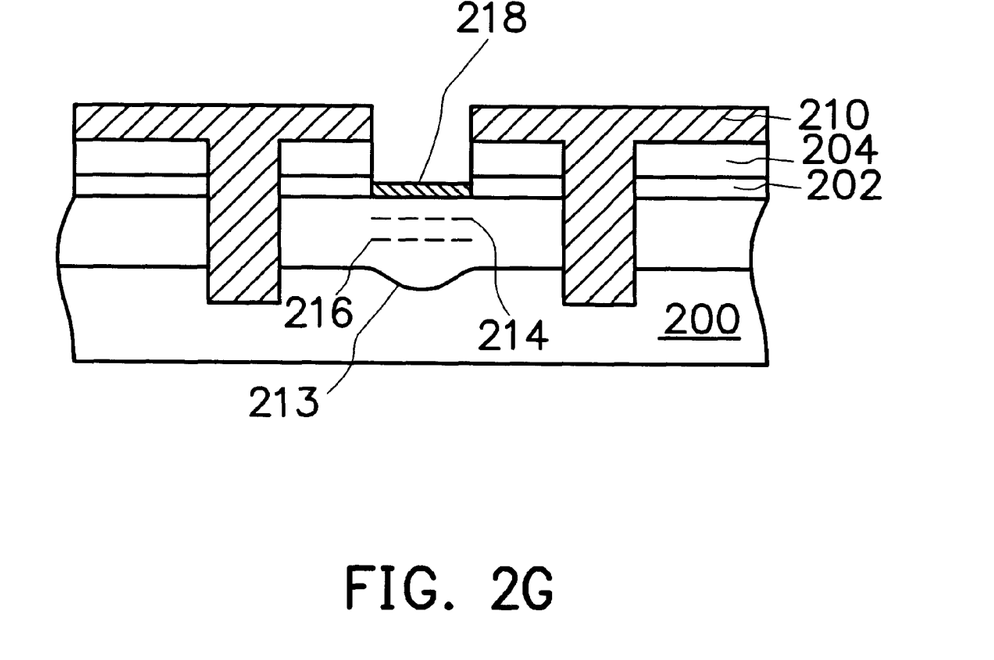

Referring to FIG. 2G, the pad oxide layer 202 exposed by the opening 212 is removed by anisotropic etching. A gate oxide layer 218 is formed on the substrate 200 exposed by the opening 212, wherein the thickness of the gate oxide layer is thinner than the pad oxide layer 202. The method of forming the gate oxide layer 218 includes thermal oxidation.

Figure 2H:
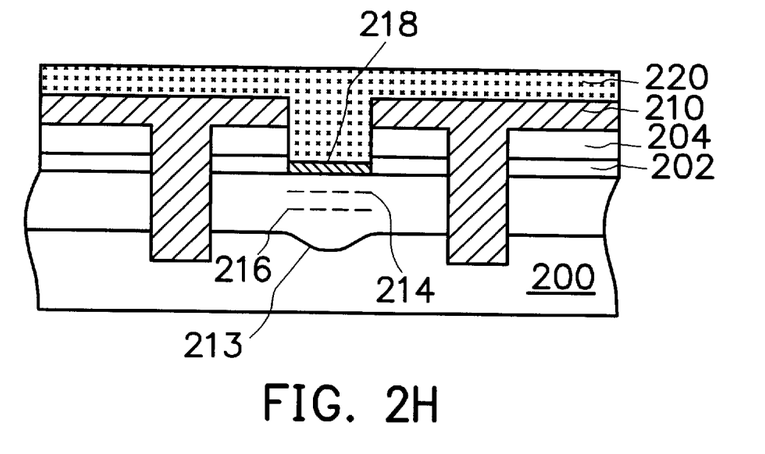

Referring to FIG. 2H, a conductive layer 220 is formed on the insulator layer 210 and fills the opening 212 by chemical vapor deposition. Preferably, the conductive layer 220 includes polysilicon.

Figure 2I:
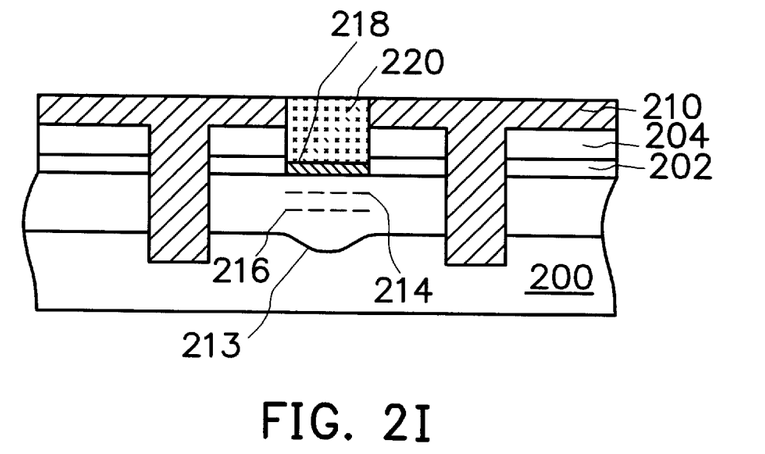

Referring to FIG. 2I, the conductive layer 220 is removed to expose the insulator layer 210. Preferably, the method of removing the conductive layer 220 includes chemical-mechanical polishing.

Figure 2J:
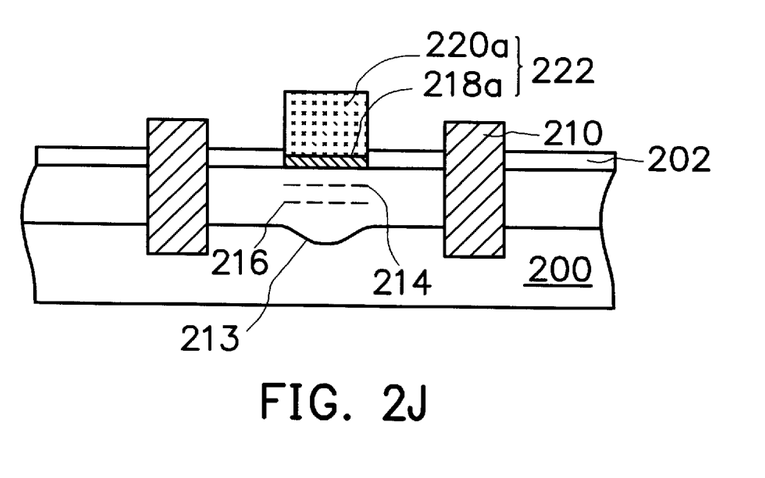

Referring to FIG. 2J, a portion of the insulator layer 210 is etched back to expose the mask layer 204. A wet etching process is performed to remove the mask layer 204 by using hot phosphoric acid as an etchant. A gate 222 is formed, wherein the gate 222 is made of the gate oxide layer 218 and a gate conductive layer 220a. In this invention the mask layer 204 is removed by wet etching; thus the damages to the sidewall of the gate conductive layer 220a are reduced. The reliability of the gate conductive layer 220a is increased.

According to the foregoing, the advantages of the invention include the following:

1. In this invention, the dopant is implanted selectively into the substrate exposed by the opening. The area where the source/drain region is subsequently formed is not doped; thus increases in the series resistance and the junction capacitance of the source/drain region are avoided.

2. The mask layer is removed by wet etching, so that the damage to the sidewall of the gate conductive layer is reduced. The reliability of the gate conductive layer is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a metal oxide semiconductor, comprising the steps of:

providing a substrate;

forming a pad oxide layer, a mask layer and a insulator layer in sequence on the substrate;

forming an opening in the mask layer and the insulator layer to expose the pad oxide layer by performing a etching;

after exposing the pad oxide layer, performing three self-aligned ion implantation processes in sequence forming three doped layers in the substrate by using the insulator and the mask layer as mask, wherein the second and third implantation processes are performed to implant dopants selectively into a portion of substrate so as to avoid ion implantation into a source/drain region, and the depths of the three doped layers are different;

removing a portion of pad oxide layer exposed by the opening; and forming a gate on the substrate exposed by the opening.

2. The method of claim 1, wherein the step of forming the gate further comprises the steps of:

forming a gate oxide layer on the substrate exposed by the opening, wherein the gate oxide layer is thinner than the pad layer;

forming a conductive layer on the insulator layer to fill the opening;

planarizing the conductive layer to expose the insulator layer;

removing a portion of the insulator to expose the mask layer; and removing the mask layer completely to form the gate.

3. The method of claim 2, wherein the insulator layer includes silicon dioxide.

4. The method of claim 2 wherein the mask layer includes silicon nitride.

5. The method of claim 2, wherein the steps of removing the mask layer include wet etching.

6. A method for fabricating a metal oxide semiconductor comprising:

providing a substrate;

forming a pad oxide layer, a mask layer and an insulator layer in sequence on the substrate;

forming an opening in the mask layer and the insulator layer to expose the pad oxide layer;

performing a first ion implantation and a second ion implantation in sequence by using the insulator and the mask layer as mask to form a first doped layer and a second doped layer in the substrate, wherein the second doped layer is limited in an area substantially corresponding to that of the exposed pad oxide layer;

removing a portion of the pad oxide layer exposed by the opening; and forming a gate on the substrate exposed by the opening.

7. The method of claim 6, further comprising:

after the second ion implantation, performing a third ion implantation by using the insulator and the mask layer as mask to form a third doped layer in the substrate, wherein the depths of the first, second, and third doped layers are different.

8. A method for fabricating a metal oxide semiconductor comprising:

providing a substrate;

forming a pad oxide layer, a mask layer and an insulator layer in sequence on the substrate;

forming an opening in the mask layer and the insulator layer to expose the pad oxide layer;

performing a self-aligned ion implantation through the exposed portion of the pad oxide layer by using the insulator and the mask layer as mask so as to form a doped layer in the substrate, wherein the doped layer is limited in an area substantially corresponding to that of the exposed portion of the pad oxide layer;

removing a portion of the pad oxide layer exposed by the opening; and forming a gate on the substrate exposed by the opening.

* * * * *